US008519731B1

(12) United States Patent
McAuley et al.

(10) Patent No.: US 8,519,731 B1
(45) Date of Patent: Aug. 27, 2013

(54) DETERMINATION OF WHETHER A LINE IS OPEN OR SHORTED IN AN INTEGRATED CIRCUIT

(75) Inventors: Cathal N. McAuley, Lucan (IE); Fergal W. Keating, Naas (IE)

(73) Assignee: Xilinx, Inc., San Jose, CA (US)

( * ) Notice: Subject to any disclaimer, the term of this patent is extended or adjusted under 35 U.S.C. 154(b) by 434 days.

(21) Appl. No.: 12/942,526

(22) Filed: Nov. 9, 2010

(51) Int. Cl.
*G01R 31/02* (2006.01)
*G01R 31/20* (2006.01)

(52) U.S. Cl.
USPC .................. 324/762.01; 324/754.01

(58) Field of Classification Search
None
See application file for complete search history.

(56) References Cited

U.S. PATENT DOCUMENTS

| 5,675,499 | A | * | 10/1997 | Lee et al. ................. 324/755.01 |
| 6,518,783 | B1 | * | 2/2003 | Birdsley et al. ............ 324/750.3 |
| 7,482,603 | B2 | | 1/2009 | Tomimatsu et al. |
| 7,888,143 | B1 | * | 2/2011 | Keating et al. ................. 438/18 |
| 2006/0012385 | A1 | | 1/2006 | Tsao et al. |

OTHER PUBLICATIONS

U.S. Appl. No. 12/182,928, filed Jul. 30, 2008, Keating et al.
McAuley, C. N., "3D failure analysis in depth profiles of sequentially made FIB cuts," *Microelectronics Reliability*, Jul. 2, 2007, pp. 1605-1608, vol. 47.
Schlangen, R. et al., "Non destructive 3D chip inspection with nano scale potential by use of backside FIB and backscattered electron microscopy," *Microelectronics Reliability*, Jul. 6, 2007, pp. 1533-1538, vol. 47.

* cited by examiner

*Primary Examiner* — Vinh Nguyen
(74) *Attorney, Agent, or Firm* — Robert M. Brush; LeRoy D. Maunu

(57) ABSTRACT

Method and apparatus for electrically charactering an integrated circuit (IC) are described. In an example, a data line in conductive interconnect of the IC is identified that is failing. First and second vertical trenches are milled in the IC along the data line to expose respective first and second cross-sections of the conductive interconnect having the data line. First and second probes are placed in contact with the data line in the first and second vertical trenches, respectively. A determination is made whether the data line is open or shorted between the first and second vertical trenches using an electrical measurement device coupled to the first and second probes.

15 Claims, 3 Drawing Sheets

DETERMINATION OF WHETHER A LINE IS OPEN OR SHORTED IN AN INTEGRATED CIRCUIT

FIELD OF THE INVENTION

One or more aspects of the present invention relate generally to integrated circuit testing and, more particularly, to electrically characterizing long data lines in an integrated circuit.

BACKGROUND

Electrical failures of data lines in lower layers of an integrated circuit (IC) can be difficult to isolate and characterize. One technique for examining such failures involves removing layers from the surface of the IC until the layer of interest is exposed, followed by electrical probing data lines on that layer. Typically, accessing the structure of interest is done by mechanical polishing or milling until the layer is reached and the failure is electrically isolated. As such, this technique is not suited to isolate failures that extend over more than one layer of the IC. Further, such a technique only allows a small segment of a data line to be exposed and inspected and thus is not suitable for longer data lines.

Another technique involves cutting a cross-section or "lamella" of the IC device and analyzing the lamella with a scanning transmission electron microscope (STEM) detector. This technique, however, requires additional steps of removing a sample of the IC from the bulk material before characterizing the data lines in the sample. Further, since this technique takes a sample of the IC, it is not suitable for characterizing longer data lines that extend across the IC.

Accordingly, there exists a need in the art for methods and apparatus for electrically characterizing long data lines in an IC that overcome the aforementioned disadvantages.

SUMMARY

An embodiment relates to a method of electrically charactering an integrated circuit (IC). The method can include: identifying a data line in conductive interconnect of the IC that is failing; milling first and second vertical trenches in the IC along the data line to expose respective first and second cross-sections of the conductive interconnect having the data line; placing first and second probes in contact with the data line in the first and second vertical trenches, respectively; and determining whether the data line is open or shorted between the first and second vertical trenches using an electrical measurement device coupled to the first and second probes.

In some embodiments, the method can further include: in response to the data line determined to be open between the first and second vertical trenches, milling a third vertical trench in the IC to expose a respective third cross-section of the conductive interconnect having the data line, the third vertical trench being between the first and second vertical trenches; moving the first probe to contact the data line in the third vertical trench; and determining whether the data line is open or shorted between the third and second vertical trenches using the electrical measurement device coupled to the first and second vertical probes. The first and second vertical trenches can be milled using a focused ion beam (FIB), for example. Each of the first and second vertical trenches can include a plurality of successively deeper vertical steps with respect to a face of the IC. Each of the vertical steps can expose a different layer of the conductive interconnect of the IC.

Another embodiment relates to a method of electrically charactering an integrated circuit (IC). The method can include: identifying a data line in conductive interconnect of the IC that is failing; milling a plurality of vertical trenches in the IC along the data line to expose a respective plurality of cross-sections of the conductive interconnect having the data line; placing first and second probes in contact with the data line in a first and a second vertical trenches of the plurality of vertical trenches, respectively; and determining whether the data line is open or shorted between the first and second vertical trenches using an electrical measurement device coupled to the first and second probes.

In some embodiments, the method further includes: moving the first probe to contact the data line in a third vertical trench of the plurality of vertical trenches; and determining whether the data line is open or shorted between the third and second vertical trenches using the electrical measurement device coupled to the first and second vertical probes. The plurality of vertical trenches can be milled using a focused ion beam (FIB), for example. Each of the plurality of vertical trenches can include a plurality of successively deeper vertical steps with respect to a face of the IC. Each of the vertical steps can expose a different layer of the conductive interconnect of the IC.

Yet another embodiment relates to an apparatus for electrically characterizing an integrated circuit (IC). The apparatus can include: a milling tool configured to mill a plurality of vertical trenches in the IC along a data line identified as failing to expose a respective plurality of cross-sections of the conductive interconnect having the data line; and an electrical measurement device configured to place first and second probes in contact with the data line in one or more pairs of the plurality of vertical trenches, and to determine whether the data line is open or shorted between the one or more pairs of vertical trenches.

In some embodiments, the apparatus further includes automatic test equipment (ATE) configured to identify the data line in conductive interconnect of the IC that is failing.

In some embodiments, the milling tool can be configured to mill first and second vertical trenches in the IC along the data line to expose respective first and second cross-sections of the conductive interconnect having the data line. The electrical measurement device can be configured to place first and second probes in contact with the data line in the first and second vertical trenches, respectively, and determine whether the data line is open or shorted between the first and second vertical trenches. The milling tool can be further configured to, in response to the electrical measurement device determining that the data line is open between the first and second vertical trenches, mill a third vertical trench in the IC to expose a respective third cross-section of the conductive interconnect having the data line, the third vertical trench being between the first and second vertical trenches. The electrical measurement device can be configured to move the first probe to contact the data line in the third vertical trench, and to determine whether the data line is open or shorted between the third and second vertical trenches.

In some embodiments, the electrical measurement device can be configured to place the first and second probes in contact with the data line in a first and a second vertical trenches of the plurality of vertical trenches, respectively, and to determine whether the data line is open or shorted between the first and second vertical trenches. The electrical measurement tool can be further configured to move the first probe to contact the data line in a third vertical trench of the plurality of vertical trenches, and to determine whether the data line is open or shorted between the third and second vertical trenches.

In some embodiments, the milling tool can be configured to use a focused ion beam (FIB) to mill the plurality of vertical trenches. Each of the plurality of vertical trenches can include a plurality of successively deeper vertical steps with respect to a face of the IC. Each of the vertical steps can expose a different layer of the conductive interconnect of the IC.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
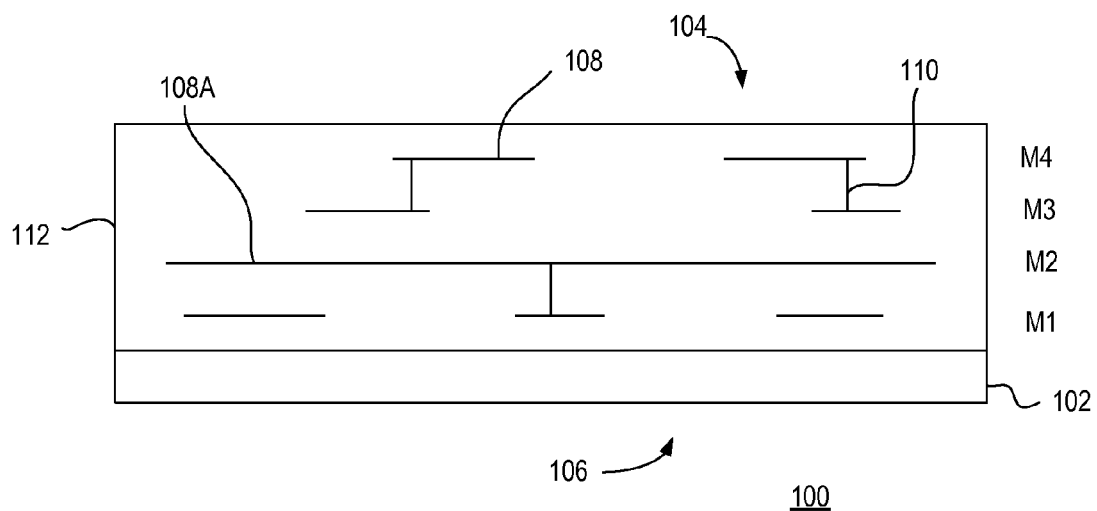
FIG. 1 is a cross-section view of an embodiment of a semiconductor device.

FIG. 1 is a cross-section view of an embodiment of a semiconductor device 100. The semiconductor device 100 may be, for example, a die of an integrated circuit (IC). The semiconductor device 100 includes a semiconductor substrate 102 and conductive interconnect 112. The conductive interconnect 112 is patterned on the substrate 102 to define a top side 104. The semiconductor device 100 includes a backside 106 opposite the top side 104. The conductive interconnect 112 generally includes a plurality of layers, each having a pattern of conductors. In the present example, the conductive interconnect 112 includes four layers designated M1, M2, M3, and M4. It is to be understood that a device may include more or less than four layers.

Each of the layers M1-M4 includes conductors 108 formed in a particular pattern. The conductive interconnect 112 includes vias 110 that electrically couple conductors between layers. Some conductors in the conductive interconnect 112 can be significantly longer than other conductors with respect to the extent of the semiconductor device 100. For example, a conductor 108A in the layer M2 is schematically shown longer than other conductors in the layers M1, M3, and M4. Conductors may also be referred to herein as "data lines", and longer conductors as "long data lines." The term "long" is used relative to lengths of other conductors on the semiconductor device 100 and is not meant to convey any particular length. Thus, if a plurality of conductors are of at most a particular length, then a long conductor can have a length greater than that particular length.

Manufactured semiconductor devices can have defects, some of which occur during formation of the conductive interconnect 112. Notably, a data line in any of the layers of the conductive interconnect 112 can have an unintentional gap or void therein, resulting in formation of two electrically isolated conductors, rather than a single data line as intended. Thus, circuitry meant to be coupled by the data line will not be coupled due to the defect, causing the semiconductor device to fail or operate in an unspecified and unintended manner.

Typically, a manufacturer learns of a defect in a semiconductor device after operational failure during testing or use by a customer. The manufacturer may then desire to analyze the semiconductor device to identify any physical defects that are causing the operational failure. Accordingly, embodiments described below are related to electrically characterizing a semiconductor device, such as an IC.

Figure 3:
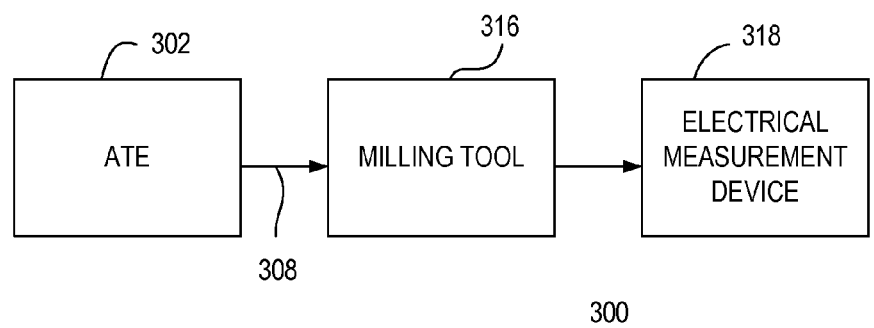
FIG. 3 is a block diagram depicting an exemplary embodiment of an electrical characterization system.
Figure 2:
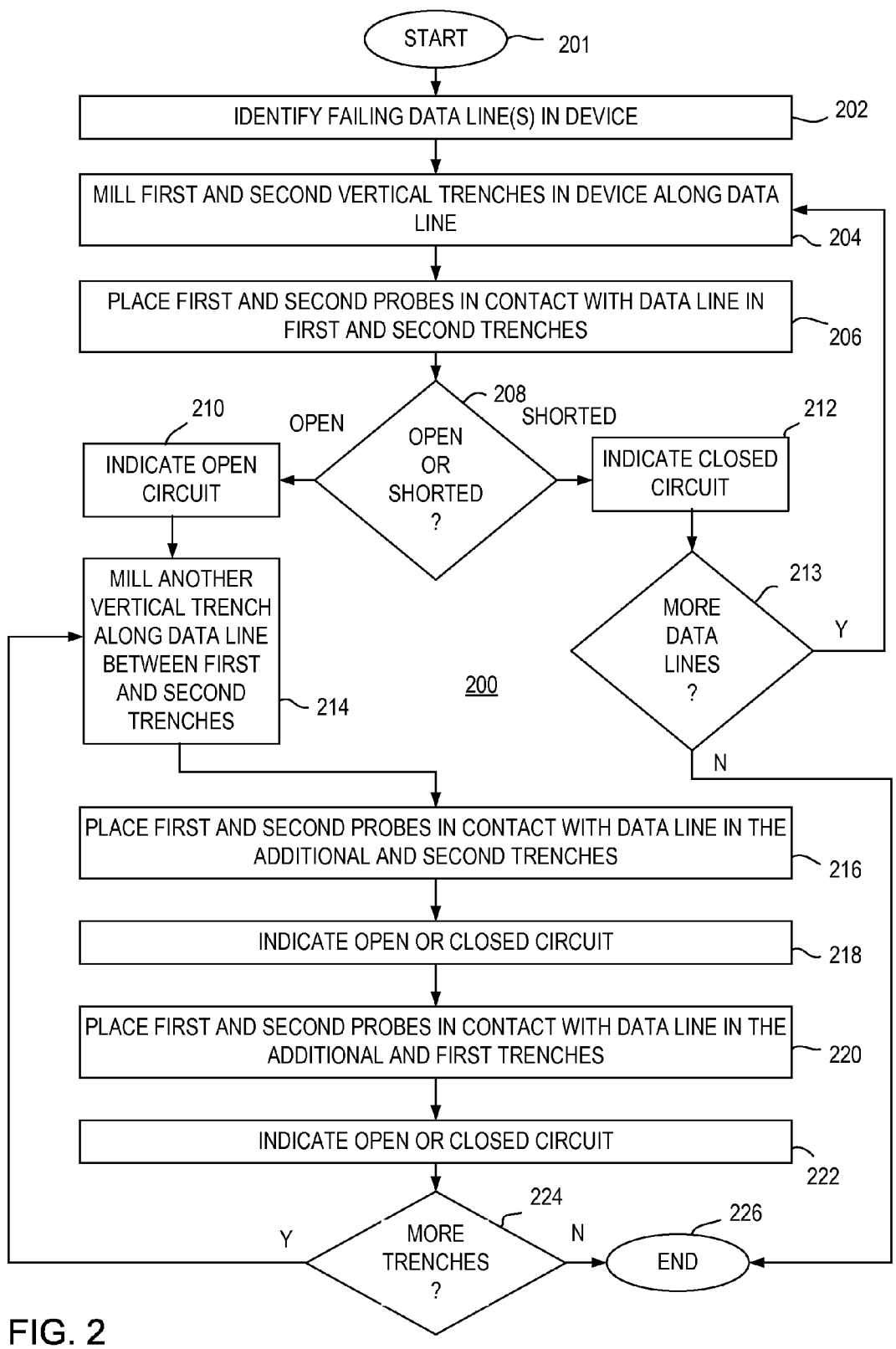
FIG. 2 is a flow diagram depicting an exemplary embodiment of a method of electrically characterizing a semiconductor device.

FIG. 2 is a flow diagram depicting an exemplary embodiment of a method 200 of electrically characterizing a semiconductor device. FIG. 3 is a block diagram depicting an exemplary embodiment of an electrical characterization system 300. With simultaneous reference to FIGS. 2 and 3, the method 200 begins at step 201. At step 202, one or more data lines are identified as failing in the semiconductor device. For example, automatic test equipment (ATE) 302 may be employed to test the functional operation of the device. A test pattern of input signals may be applied to the device and resulting actual output signals captured from the device. The actual output signals can be compared to expected output signals for the given test pattern of input signals. In this manner, the logic circuitry that is functionally failing can be identified ("failing logic circuitry"). Given the failing logic circuitry, one or more data lines coupled to the circuitry can be identified based on the known design of the semiconductor device ("identified data lines 308"). While this ATE testing may be used to identify which particular data line(s) is/are failing, such testing does not identify the particular physical location of defect(s) in the data line(s) within the semiconductor device. Those skilled in the art will appreciate that other techniques can be used to identify failing data lines. For example, failing data lines can be identified through failed operation of the device in an environment other than an ATE environment.

For purposes of clarity by example, assume step 202 identified one data line. It will be apparent to one skilled in the art that the method 200 can be applied to test multiple data lines. At step 204, first and second vertical trenches are milled in the semiconductor device along an identified data line to expose respective first and second cross-sections of the conductive interconnect. The first and second vertical trenches can be milled using a milling tool 316. In some embodiments, the milling tool 316 uses a focused ion beam (FIB) process to cut the first and second trenches. In some embodiments, the milling tool 316 employs a milling process such that the trenches can include a plurality of successively deeper vertical steps with respect to a face of the semiconductor device (e.g., the top or active side). For example, an FIB can be used to cut the trenches layer-by-layer through the conductive interconnect such that each of the vertical steps exposes a different layer in the conductive interconnect.

At step 206, first and second probes are placed in contact with the data line in the first and second trenches, respectively. For example, an electrical measurement device 318 can include probes, such as nano-manipulators. The electrical measurement device 318 can include a curve tracer or parametric analyzer or like type devices known in the art. At step 208, a determination is made whether the data line is open or shorted between the first and second trenches using the electrical measurement device 318. That is, the electrical measurement device 318 determines whether one probe can be electrically coupled to another probe through the data line (i.e., whether electric current can flow between the two probes through the data line). If not, the method 200 proceeds to step 210, where the electrical measurement device 318 indicates an open circuit (data line failure). Otherwise, the method 200 proceeds to step 212, where the electrical measurement device 318 indicates a closed circuit (and hence no electrical defect in the data line between the first and second trenches). If the data line is not failing (i.e., there is a closed circuit), the method 200 can proceed from step 212 to step 213, where a determination is made whether another data line should be checked. If so, the method 200 returns to step 204 and repeats for an additional data line. In general, steps 204 through 213 can be performed again for each data line identified at step 202. If not, the method 200 ends at step 226.

In some embodiments, the method 200 proceeds from step 210 to step 214. At step 214, another vertical trench is milled in the semiconductor device along the identified data line to expose another cross-section of the conductive interconnect between the first and second cross-sections (e.g., a third vertical trench given only the first and second vertical trenches described above). The additional trench can be milled by the milling tool 316 substantially as described above with respect to the first and second vertical trenches. At step 216, the first and second probes of the electrical measurement device 318 are placed in contact with the data line in the additional vertical trench and one of the first or second vertical trenches. For purposes of clarity by example, assume the first and second probes are placed in contact with the additional and second vertical trenches.

At step 218, the electrical measurement device 318 indicates whether the data line is open or shorted between the additional and second trenches. That is, the electrical measurement device 318 determines whether one probe can be electrically coupled to another probe through the data line. At step 220, the first and second probes can be placed in contact with the data line in the additional and first vertical trenches (i.e., one of the probes stays in contact with the additional vertical trench, and one is moved from the second vertical trench to the first vertical trench). At step 222, the electrical measurement device 318 indicates whether the data line is open or shorted between the additional and first trenches. In this manner, the defect in the data line can be isolated along the data line between the initial first and second vertical trenches. The open or closed circuit indications can be recorded as additional vertical trenches are milled between the initial first and second vertical trenches. The open and closed circuit indications can be used to both determine the number of defects and their location along the data line. Thus, at step 224, a determination is made whether another vertical trench should be formed. If so, the method 200 returns to step 214 and repeats. Otherwise, the method 200 proceeds to step 226 and ends.

The electrical characterization system 300 is logically shown as separate tools of the ATE 302, the milling tool 316, and the electrical measurement device 318. It is to be understood that the tools can physically be part of one or more tools through which the device can be passed. For example, the milling tool 316 and the electrical measurement device 318 can be part of the same physical tool, such that the device can be passed back and forth from milling to electrical measurement to achieve the method 200 described above. In general, the milling tool is configured to mill a plurality of vertical trenches in the IC along a data line identified as failing to expose a respective plurality of cross-sections of the conductive interconnect having the data line. The electrical measurement device is configured to place first and second probes in contact with the data line in one or more pairs of the plurality of vertical trenches and determine whether the data line is open or shorted between the one or more pairs of vertical trenches.

Figure 4:
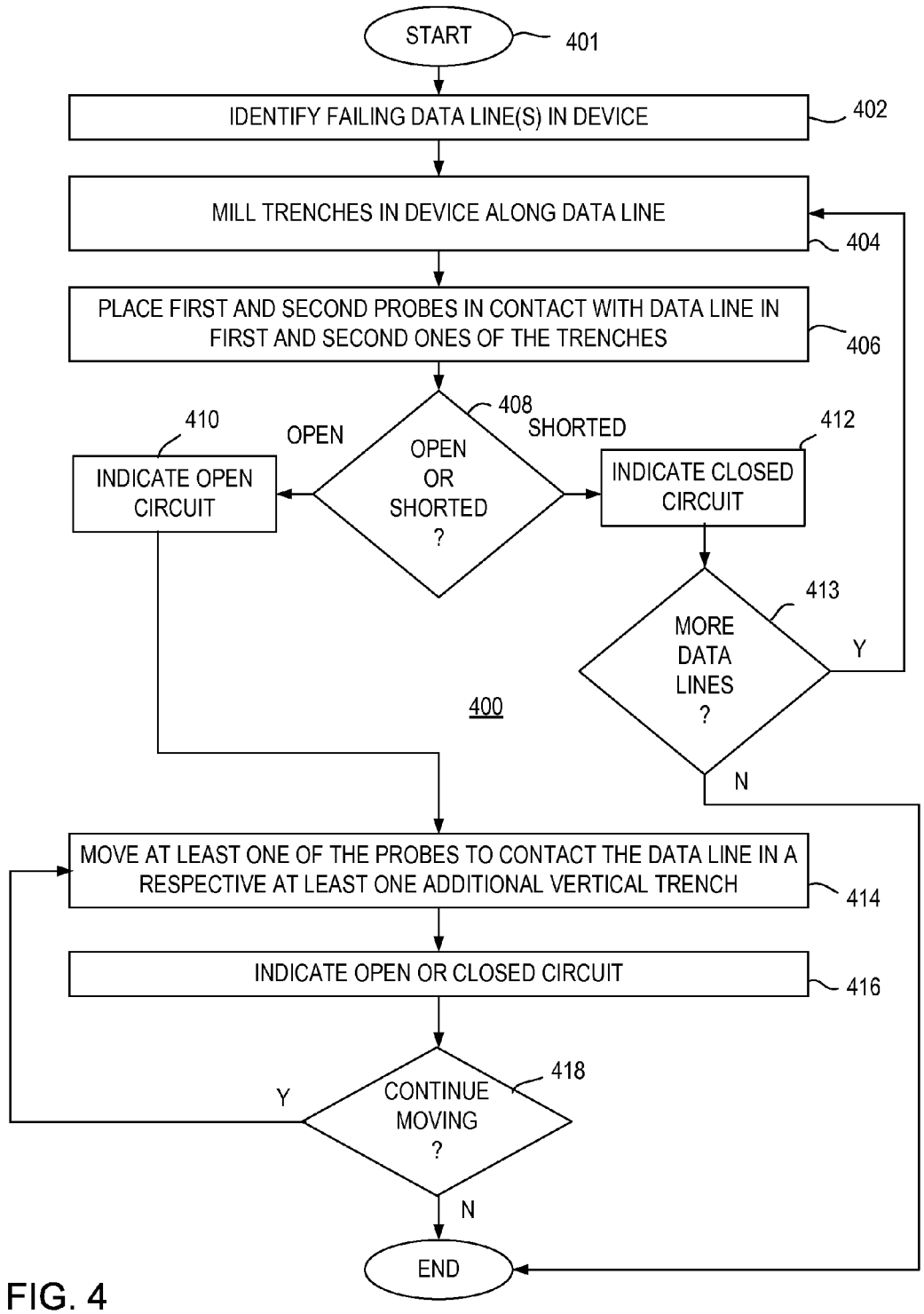
FIG. 4 is a flow diagram depicting another exemplary embodiment of a method of electrically characterizing a semiconductor device.

FIG. 4 is a flow diagram depicting another exemplary embodiment of a method 400 of electrically characterizing a semiconductor device. The method 400 begins at step 401. At step 402, one or more data lines are identified as failing in the semiconductor device. The data lines can be identified as described above. At step 404, a plurality of vertical trenches are milled in the IC along the data line to expose a respective plurality of cross-sections of the conductive interconnect having the data line. The trenches can be milled as described above. At step 406, first and second probes of the electrical measurement device 318 are placed in contact with the data line in a first and a second vertical trenches of the plurality of vertical trenches, respectively.

At step 408, a determination is made whether the data line is open or shorted between the first and second trenches using the electrical measurement device 318. That is, the electrical measurement device 318 determines whether one probe can be electrically coupled to another probe through the data line (i.e., whether electric current can flow between the two probes through the data line). If not, the method 400 proceeds to step 410, where the electrical measurement device 318 indicates an open circuit (data line failure). Otherwise, the method 400 proceeds to step 412, where the electrical measurement device 318 indicates a closed circuit (and hence no electrical defect in the data line between the first and second trenches). If the data line is not failing (i.e., if there is a closed circuit), the method 400 can proceed from step 412 to step 413, where a determination is made whether another data line should be checked. If so, the method 400 returns to step 404 and repeats for an additional data line. In general, steps 404 through 413 can be performed again for each data line identified at step 402. If not, the method 400 ends at step 499.

In some embodiments, the method 400 proceeds from step 410 to step 414. At step 414, at least one of the first and second probes is moved to contact the data line in a respective at least one additional vertical trench of the plurality of vertical trenches. At step 416, the electrical measurement device 318 indicates whether the data line is open or shorted between the probes. At step 418, a determination is made whether to continue moving the probes. For example, there may be a different pair of trenches not yet tested. If so, the method 400 returns to step 414 and repeats. Otherwise, the method 400 ends at step 499. Thus, in the method 400, all of the vertical trenches desired are milled before electrical characterization. In the method 200, trenches are milled, then tested, additional trench(es) are milled, then tested, and so on.

Method and apparatus for electrically characterizing long data lines in an integrated circuit has been described. The electrical characterization technique described herein allows physical testing of long data lines at any metal layer anywhere on the IC device. The electrical characterization technique can be used on devices that cannot be de-processed using traditional parallel polishing techniques due to the length of the data line and/or the positioning of the data line being tested (e.g., near the edge of the IC die).

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:
1. A method of electrically characterizing an integrated circuit (IC), comprising:
    identifying a data line in conductive interconnect of the IC that is failing;

milling first and second vertical trenches in the IC along the data line to expose respective first and second cross-sections of the conductive interconnect having the data line;
placing first and second probes in contact with the data line in the first and second vertical trenches, respectively;
determining whether the data line is open or shorted between the first and second vertical trenches using an electrical measurement device coupled to the first and second probes;
in response to the data line determined to be open between the first and second vertical trenches, milling a third vertical trench in the IC to expose a respective third cross-section of the conductive interconnect having the data line, the third vertical trench being between the first and second vertical trenches;
moving the first probe to contact the data line in the third vertical trench; and
determining whether the data line is open or shorted between the third and second vertical trenches using the electrical measurement device coupled to the first and second vertical probes.

2. The method of claim 1, wherein the first and second vertical trenches are milled using a focused ion beam (FIB).

3. The method of claim 2, wherein each of the first and second vertical trenches includes a plurality of successively deeper vertical steps with respect to a face of the IC.

4. The method of claim 3, wherein each of the vertical steps exposes a different layer of the conductive interconnect of the IC.

5. A method of electrically characterizing an integrated circuit (IC), comprising:
identifying a data line in conductive interconnect of the IC that is failing;
milling a plurality of vertical trenches in the IC along the data line to expose a respective plurality of cross-sections of the conductive interconnect having the data line;
placing first and second probes in contact with the data line in a first and a second vertical trenches of the plurality of vertical trenches, respectively;
determining whether the data line is open or shorted between the first and second vertical trenches using an electrical measurement device coupled to the first and second probes;
moving the first probe to contact the data line in a third vertical trench of the plurality of vertical trenches; and
determining whether the data line is open or shorted between the third and second vertical trenches using the electrical measurement device coupled to the first and second vertical probes.

6. The method of claim 5, wherein the plurality of vertical trenches are milled using a focused ion beam (FIB).

7. The method of claim 6, wherein each of the plurality of vertical trenches includes a plurality of successively deeper vertical steps with respect to a face of the IC.

8. The method of claim 7, wherein each of the vertical steps exposes a different layer of the conductive interconnect of the IC.

9. An apparatus for electrically characterizing an integrated circuit (IC), comprising:
a milling tool configured to mill a plurality of vertical trenches in the IC along a data line identified as failing to expose a respective plurality of cross-sections of the conductive interconnect having the data line; and
an electrical measurement device configured to place first and second probes in contact with the data line in one or more pairs of the plurality of vertical trenches, and to determine whether the data line is open or shorted between the one or more pairs of vertical trenches:
wherein the electrical measurement device is configured to place the first and second probes in contact with the data line in a first and a second vertical trenches of the plurality of vertical trenches, respectively, and to determine whether the data line is open or shorted between the first and second vertical trenches; and
wherein the electrical measurement device is configured to move the first probe to contact the data line in a third vertical trench of the plurality of vertical trenches, and to determine whether the data line is open or shorted between the third and second vertical trenches.

10. The apparatus of claim 9, further comprising:
automatic test equipment (ATE) configured to identify the data line in conductive interconnect of the IC that is failing.

11. The apparatus of claim 9, wherein:
the milling tool is configured to mill first and second vertical trenches in the IC along the data line to expose respective first and second cross-sections of the conductive interconnect having the data line; and
the electrical measurement device is configured to place first and second probes in contact with the data line in the first and second vertical trenches, respectively, and to determine whether the data line is open or shorted between the first and second vertical trenches.

12. The apparatus of claim 11, wherein:
the milling tool is configured to, in response to the electrical measurement device determining that the data line is open between the first and second vertical trenches, mill a third vertical trench in the IC to expose a respective third cross-section of the conductive interconnect having the data line, the third vertical trench being between the first and second vertical trenches, and
the electrical measurement device is configured to move the first probe to contact the data line in the third vertical trench, and to determine whether the data line is open or shorted between the third and second vertical trenches.

13. The apparatus of claim 9, wherein the milling tool is configured to use a focused ion beam (FIB) to mill the plurality of vertical trenches.

14. The apparatus of claim 13, wherein each of the plurality of vertical trenches includes a plurality of successively deeper vertical steps with respect to a face of the IC.

15. The apparatus of claim 14, wherein each of the vertical steps exposes a different layer of the conductive interconnect of the IC.

* * * * *